US012799370B2

(12) United States Patent
Uchiyama et al.

(10) Patent No.: US 12,799,370 B2
(45) Date of Patent: Nov. 17, 2026

(54) CROSSLINKED POLYESTER RESIN, ADHESIVE AGENT COMPOSITION, AND ADHESIVE SHEET

(71) Applicant: TOYOBO CO., LTD., Osaka (JP)

(72) Inventors: Shoko Uchiyama, Shiga (JP); Hideki Tanaka, Shiga (JP); Mikihiro Hayashi, Aichi (JP)

(73) Assignee: TOYOBO CO., LTD., Osaka (JP)

( * ) Notice: Subject to any disclaimer, the term of this patent is extended or adjusted under 35 U.S.C. 154(b) by 85 days.

(21) Appl. No.: 18/699,753

(22) PCT Filed: Oct. 13, 2022

(86) PCT No.: PCT/JP2022/038205
§ 371 (c)(1),
(2) Date: Apr. 9, 2024

(87) PCT Pub. No.: WO2023/063386
PCT Pub. Date: Apr. 20, 2023

(65) Prior Publication Data

US 2024/0409782 A1 Dec. 12, 2024

(30) Foreign Application Priority Data

Oct. 14, 2021 (JP) ................................ 2021-168544

(51) Int. Cl.
*C09J 7/35* (2018.01)
*C09J 5/06* (2006.01)
(Continued)

(52) U.S. Cl.
CPC . *C09J 7/35* (2018.01); *C09J 5/06* (2013.01); *C09J 2203/326* (2013.01);
(Continued)

(58) Field of Classification Search
CPC . C09J 7/35; C09J 5/06; C09J 2203/326; C09J 2301/304; C09J 167/02;
(Continued)

(56) References Cited

U.S. PATENT DOCUMENTS

2017/0047142 A1* 2/2017 Disson ............... C08G 59/4238
2023/0383053 A1 11/2023 Uchiyama et al.
2023/0383115 A1 11/2023 Uchiyama et al.

FOREIGN PATENT DOCUMENTS

JP H03287684 A * 12/1991
JP 2011-159693 8/2011
(Continued)

OTHER PUBLICATIONS

Altuna et al., "Epoxy vitrimers with a covalently bonded tertiary amine as catalyst of the transesterification reaction", European Polymer Journal, 113, pp. 297-304, Jan. 23, 2019. (Year: 2019).*
(Continued)

*Primary Examiner* — Christopher W Raimund
(74) *Attorney, Agent, or Firm* — Wenderoth, Lind & Ponack, L.L.P.

(57) ABSTRACT

An adhesive sheet having excellent dielectric breakdown reliability and sheet life property at room temperature while having high adhesiveness to resin and metal base materials such as a polyimide film and a copper foil, high heat resistance, and high strength; and a crosslinked polyester resin suitable for the adhesive sheet are provided. The crosslinked polyester resin has a structure obtained by reacting a polyester resin having a carboxy group on a side chain with an epoxy compound; has a time for which a relaxation modulus reaches 0.37 times greater than an initial relaxation modulus when measured at a shear strain of 10% and 180° C. with a vertical stress of 0.1 N applied using a rheometer of $1\times10^1$ to $1\times10^4$ seconds; and satisfies at least one of the following requirements: (1) a transesterification
(Continued)

catalyst is contained, and (2) the epoxy compound is an epoxy amine compound having a tertiary amino group.

11 Claims, 1 Drawing Sheet

(51) Int. Cl.
*H05K 1/02* (2006.01)
*H05K 3/38* (2006.01)

(52) U.S. Cl.
CPC ....... *C09J 2301/304* (2020.08); *H05K 1/0277* (2013.01); *H05K 3/386* (2013.01)

(58) Field of Classification Search
CPC .. C09J 2463/00; C09J 2467/00; C09J 163/00; H05K 1/0277; H05K 3/386; H05K 1/03; C08G 59/4276; C08G 63/916
See application file for complete search history.

(56) References Cited

FOREIGN PATENT DOCUMENTS

| | | | |
|---|---|---|---|
| JP | 2014-141603 | 8/2014 | |
| JP | 2018-193537 | 12/2018 | |
| JP | 2019-119872 | 7/2019 | |
| JP | 2021-66865 | 4/2021 | |
| WO | 2018/105543 | 6/2018 | |
| WO | WO-2018105543 A1 * | 6/2018 | ............... H05K 3/38 |
| WO | 2018/179707 | 10/2018 | |
| WO | 2021/200713 | 10/2021 | |
| WO | 2022/080469 | 4/2022 | |
| WO | 2022/080470 | 4/2022 | |

OTHER PUBLICATIONS

Hayashi et al., "Synthesis of amorphous low Tg polyesters with multiple COOH side groups and their utilization for elastomeric vitrimers based on post-polymerization cross-linking", Polymer Chemistry, 10, pp. 2047-2056, Mar. 18, 2019. (Year: 2019).*
Extended European Search Report dated Aug. 21, 2025 in corresponding European Patent Application No. 22881081.8.
Mikihiro Hayashi, "Dominant Factor of Bond-Exchange Rate for Catalyst-Free Polyester Vitrimers with Internal Tertiary Amine Moieties", ACS Applied Polymer Materials, vol. 2, No. 12, Nov. 2020, pp. 5365-5370.
Mikihiro Hayashi et al. "Synthesis of amorphous low T g polyesters with multiple COOH side groups and their utilization for elastomeric vitrimers based on post-polymerization cross-linking", Polymer Chemistry, vol. 10, No. 16, Jan. 2019, pp. 2047-2056.
International Search Report issued Jan. 10, 2023 in International (PCT) Application No. PCT/JP2022/038205.
Office Action issued Dec. 31, 2025 in corresponding Taiwanese Patent Application No. 111138964, with English machine Translation.

* cited by examiner

[FIG. 1]
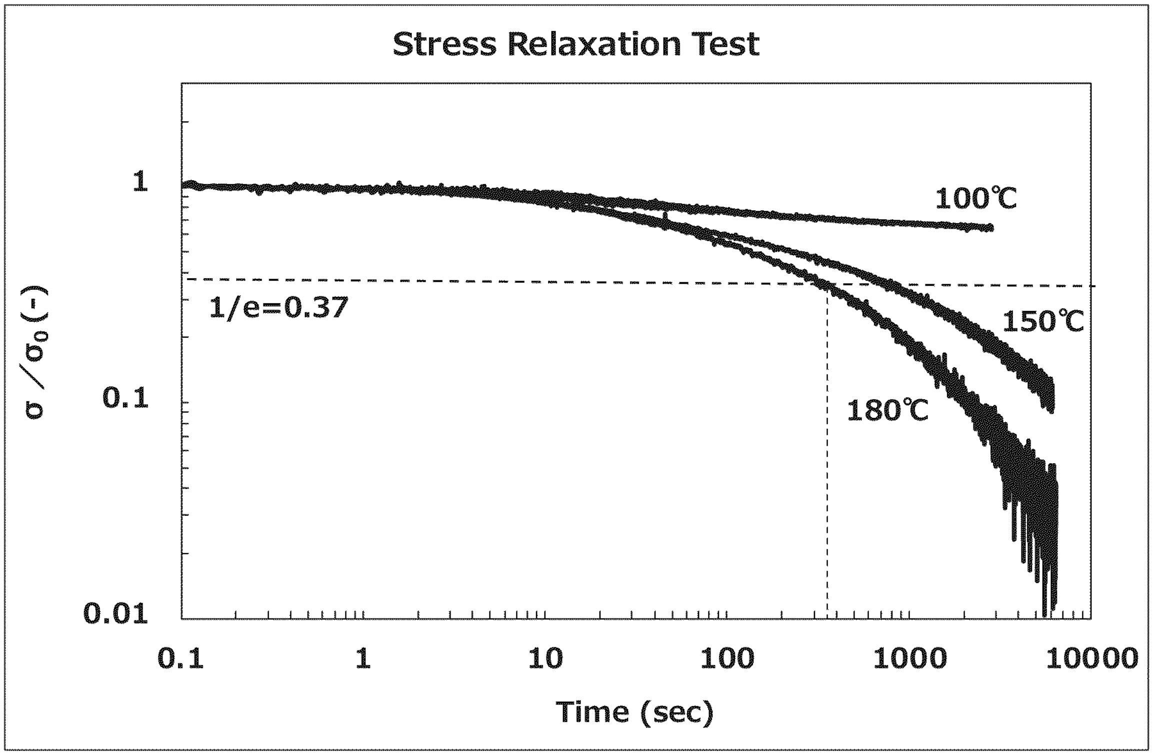
[FIG.2]
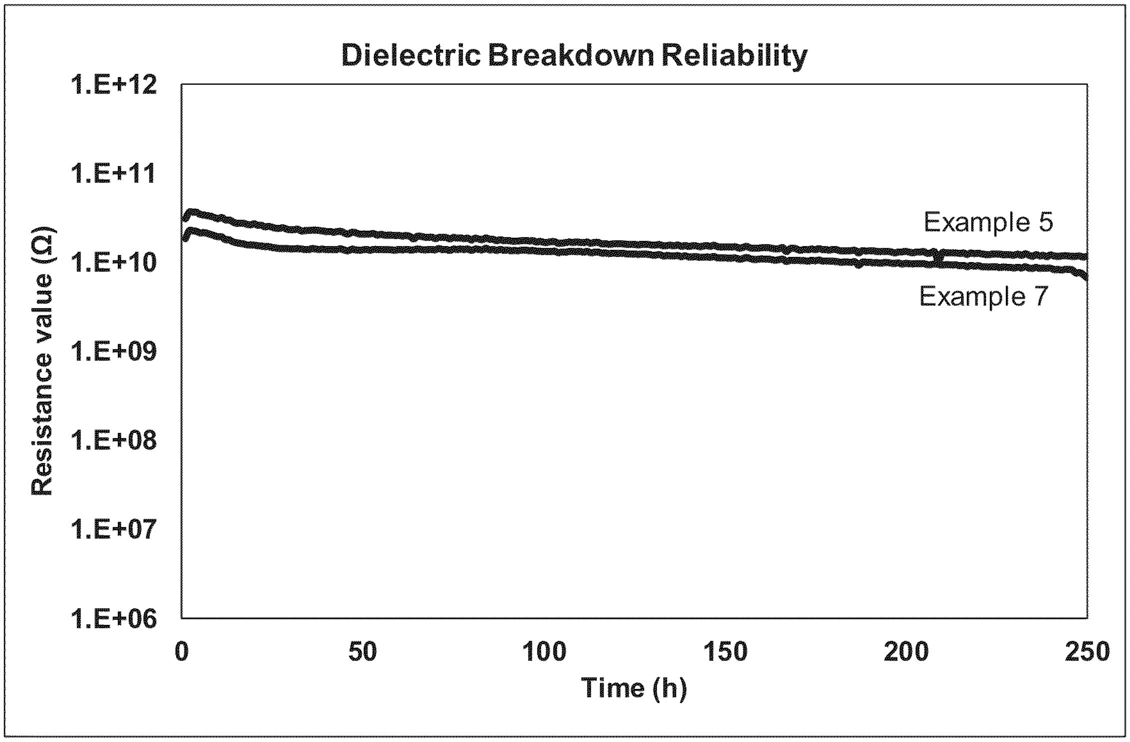

CROSSLINKED POLYESTER RESIN, ADHESIVE AGENT COMPOSITION, AND ADHESIVE SHEET

TECHNICAL FIELD

The present invention relates to a crosslinked polyester resin. The present invention also relates to an adhesive agent composition containing the crosslinked polyester resin, an adhesive sheet containing the crosslinked polyester resin, and a printed wiring board and a coverlay film each including the adhesive sheet.

BACKGROUND ART

Conventionally, epoxy-based adhesive agents have been considered as adhesive agents used for adhering electronic circuit boards, flexible printed wiring boards (hereinafter sometimes referred to as FPCs), etc. The adhesive agents used for such applications are required to have good adhesiveness to a substrate material and are also required to have high heat resistance to withstand a temperature of 200° C. or higher, which is a condition for solder reflow during component mounting.

Also, in recent years, adhesive sheets obtained by making adhesive agents into a sheet shape have come to be used for such applications, but the adhesive sheets used for such applications are required to suppress a decrease in connection reliability caused by thermal stress generated due to the use of various materials having different thermal expansion coefficients and to improve embeddability with respect to the irregularities of a wiring board. As a means for solving this, an adhesive sheet for which an aliphatic or alicyclic epoxy resin is blended with acrylic rubber has been proposed (Patent Literature 1).

RELATED ART DOCUMENT

Patent Document

Patent Document 1: JP-A-2011-159693

DISCLOSURE OF THE INVENTION

Problems to be Solved by the Invention

However, the adhesive sheet of Patent Document 1 contains a curing agent, and the adhesive sheet is formed in a so-called B-stage (half-cured state). Therefore, a curing reaction proceeds during storage, thereby causing a problem with the usable time (sheet life property) of the adhesive sheet. In addition, since the adhesive sheet is of a curing type, there is also a problem with the reliability of dielectric breakdown due to curing shrinkage.

An object of the present invention is to provide an adhesive sheet having excellent dielectric breakdown reliability and having sheet life property at room temperature while having high adhesiveness to a resin base material such as a polyimide film and a metal base material such as a copper foil, high heat resistance, and high strength, and to provide a crosslinked polyester resin suitable for the adhesive sheet.

Solutions to the Problems

As a result of thorough studies being conducted in order to solve the above problems, the present inventors have found that the following crosslinked polyester resin can achieve the above object and have completed the present invention. That is, an embodiment of the present invention is, for example, any of the following [1] to [11].

[1] A crosslinked polyester resin (C) having a structure obtained by reacting a polyester resin (A) having a carboxy group on a side chain with an epoxy compound (B), wherein a time for which a relaxation modulus reaches 0.37 times as much as an initial relaxation modulus when measured at a shear strain of 10% and 180° C. with a vertical stress of 0.1 N applied using a rheometer is $1\times10^{1}$ seconds to $1\times10^{4}$ seconds, and the crosslinked polyester resin (C) satisfies at least one of the following requirements (1) and (2), (1) a transesterification catalyst (D) is contained, and (2) the epoxy compound (B) is an epoxy amine compound (E) having a tertiary amino group.

[2] The crosslinked polyester resin (C) according to [1], which has an elastic modulus of 0.1 MPa or higher and 1.2 MPa or lower at a temperature equal to or higher than a stress relaxation initiation temperature, when the elastic modulus is determined by using a dynamic viscoelasticity measuring device under a measurement temperature between −100° C. and 250° C. at a frequency of 1 Hz.

[3] The crosslinked polyester resin (C) according to [1] or [2], wherein the polyester resin (A) has an acid value of 7 to 40 mg KOH/g.

[4] The crosslinked polyester resin (C) according to any one of [1] to [3], wherein the polyester resin (A) contains a polymer polyol (a1) having a number average molecular weight of 7,000 or higher, a polymer polyol (a2) having a number average molecular weight of 1,000 or higher and lower than 7,000, and tetracarboxylic dianhydride.

[5] A method for preparing a crosslinked polyester resin (C), the method comprising:

(i) heating a mixture containing a polyester resin (A) having a carboxy group on a side chain, an epoxy compound (B), and a transesterification catalyst (D), or (ii) heating a mixture containing a polyester resin (A) having a carboxy group on a side chain and an epoxy amine compound (E) having a tertiary amino group.

[6] An adhesive agent composition containing the crosslinked polyester resin (C) according to any one of [1] to [4].

[7] An adhesive sheet comprising an adhesive agent layer made of the crosslinked polyester resin (C) according to any one of [1] to [4].

[8] The adhesive sheet according to [7], which has a 90° peel strength of 0.5 N/mm or higher when the 90° peel strength is measured from a laminate film comprising the adhesive sheet positioned between a polyimide film and a copper foil.

[9] A printed wiring board comprising the adhesive sheet according to [7] or [8].

[10] A coverlay film comprising the adhesive sheet according to [7] or [8].

[11] A method for producing the printed wiring board according to [9], the method comprising an attaching and heating step, wherein the attaching and heating step is conducted at a temperature equal to or higher than the stress relaxation initiation temperature of the crosslinked polyester resin (C).

Effects of the Invention

The crosslinked polyester resin of the present invention forms a crosslinked structure at room temperature, and thus has high strength and excellent adhesiveness, and also has storage stability. In addition, the crosslinked polyester resin exhibits softening behavior at high temperatures and therefore has followability with respect to a base material, and is also capable of adhering base materials to each other without defects such as cracks caused by the thermal expansion difference between the base materials. Therefore, the crosslinked polyester resin can be suitably used as an adhesive agent for a printed wiring board, and is particularly useful as an adhesive sheet having an excellent sheet life property and dielectric breakdown reliability.

BRIEF DESCRIPTION OF THE DRAWING

FIG. 1 shows the results of stress relaxation measurement of the crosslinked polyester resin obtained in Example 1.

FIG. 2 shows the results of dielectric breakdown reliability of Examples 5 and 7.

MODE FOR CARRYING OUT THE INVENTION

A crosslinked polyester resin according to an embodiment of the present invention is a crosslinked polyester resin (C) which is a reaction product of a polyester resin (A) having a carboxy group on a side chain and an epoxy compound (B).

<Polyester Resin (A) Having Carboxy Group on Side Chain>

The polyester resin (A) having a carboxy group on a side chain is a resin having a carboxy group on a side chain of an polyester resin. Here, the side chain may have a structure having a carboxy group on a substituent (e.g., an aliphatic hydrocarbon group, an aromatic hydrocarbon group, an alicyclic hydrocarbon group, etc.) branched from the main chain of an polyester resin, or may have a structure having a carboxy group directly on an polyester resin. The side chain preferably has a structure having a carboxy group directly on an polyester resin. The polyester resin (A) having a carboxy group on a side chain preferably has an acid value of 7 mg KOH/g or higher. The acid value is more preferably 10 mg KOH/g or higher since crosslinking with the epoxy compound (B) sufficiently proceeds and heat resistance is improved. In addition, the acid value is preferably 40 mg KOH/g or lower and more preferably 30 mg KOH/g or lower. Moreover, the acid value derived from the carboxy group on the side chain is preferably 5 mg KOH/g or higher and more preferably 10 mg KOH/g or higher. When the acid value is the above lower limit or higher, the heat resistance becomes good due to the crosslinking with the epoxy compound (B). When the acid value is the above upper limit or lower, ester bond exchange is likely to occur without suppressing the movement of the molecules themselves due to the appropriate crosslink density, and stress relaxation and softening are sufficient, resulting in good adhesiveness. The polyester resin (A) having a carboxy group on a side chain preferably contains ester bonds and carboxy groups at multiple points in a molecule.

The polyester resin (A) having a carboxy group on a side chain has a number average molecular weight of preferably than 5000 or more, more preferably 10000 or more, and further preferably 12000 or more. In addition, the number average molecular weight is preferably 50000 or less, more preferably 25000 or less, and further preferably 20000 or less. When the number average molecular weight is set to be in the above range, it is easier to control the acid value of the polyester resin (A).

The polyester resin (A) has a glass transition temperature of preferably 0° C. or higher, more preferably 5° C. or higher, and further preferably 10° C. or higher. On the other hand, the glass transition temperature is preferably 110° C. or lower, more preferably 85° C. or lower, and further preferably 65° C. or lower.

The polyester resin (A) having a carboxy group on a side chain needs to have a side chain (hereinafter, also referred to as branched structure) in a molecule. In order for the polyester resin (A) to have a branched structure, a copolymerization component that is a material of the polyester resin (A) preferably has a branched structure. The polyester resin (A) having a carboxy group on a side chain is preferably a resin obtained by reacting (copolymerizing) a polymer polyol (a) with a trivalent or higher polycarboxylic acid component to impart carboxy groups, but may be a resin obtained by adding a monomer having a carboxy group to a polyester obtained by a reaction of a polycarboxylic acid component and a polyalcohol component and having a reaction moiety.

<Polymer Polyol (a)>

The polymer polyol has an acid value of preferably 0.1 mg KOH/g or more, more preferably 0.2 mg KOH/g or more, and further preferably 0.3 mg KOH/g or more. In addition, the acid value is preferably 20 mg KOH/g or less, more preferably 15 mg KOH/g or less, and further preferably 10 mg KOH/g or less.

The polymer polyol (a) has a glass transition temperature of preferably −10° C. or higher, more preferably 0° C. or higher, and further preferably 5° C. or higher. In addition, the glass transition temperature is preferably 100° C. or lower, more preferably 80° C. or lower, and further preferably 60° C. or lower.

The polymer polyol (a) has a number average molecular weight of preferably 1000 or more, more preferably 2000 or more, and further preferably 3000 or more. In addition, the number average molecular weight is preferably 30000 or less, more preferably 25000 or less, and further preferably 20000 or less.

The polymer polyol (a) is preferably a copolymer (polymer polyester polyol) of a polycarboxylic acid component and a polyol component. The polycarboxylic acid component used for the polymer polyester polyol is preferably an aromatic dicarboxylic acid component from the viewpoint of increasing the cohesion power of the resin and improving strength. The aromatic dicarboxylic acid component is not particularly limited, and there may be exemplified terephthalic acid, isophthalic acid, orthophthalic acid, naphthalene-dicarboxylic acid, biphenyl dicarboxylic acid and diphenic acid. There may be also exemplified an aromatic dicarboxylic acid having a sulfonic acid group such as sulfoterephthalic acid, 5-sulfo-isophthalic acid, 4-sulfophthalic acid, 4-sulfonaphthalene-2,7-dicarboxylic acid, and 5-(4-sulfophenoxy)-isophthalic acid, and an aromatic dicarboxylic acid having a sulfonic acid base such as metal salt thereof and ammonium salt thereof etc. One or more member(s) can be selected therefrom. Among them, terephthalic acid, isophthalic acid, or mixtures thereof is particularly preferred.

Another example of polycarboxylic acid component is alicyclic dicarboxylic acids such as 1,4-cyclohexanedicarboxylic acid, 1,3-cyclohexanedicarboxylic acid, 1,2-cyclohexanedicarboxylic acid and anhydrides thereof, aliphatic dicarboxylic acids such as succinic acid, adipic acid, azelaic acid, sebacic acid, dodecanedioic acid, dimer acid; and unsaturated bond-containing dicarboxylic acids such as fumaric acid, maleic acid, and their anhydrides. In addition, thiomalic acid having a thiol group in a molecular structure, and biomass-derived 2,5-furandicarboxylic acid (FDCA) can also be used.

The polyalcohol component used for the polymer polyester polyol is preferably a glycol component. The glycol component is preferably an aliphatic glycol, an alicyclic glycol, an aromatic-containing glycol, or an ether bond-containing glycol. As to examples of the aliphatic glycol, there may be exemplified ethylene glycol, 1,2-propylene glycol, 1,3-propanediol, 1,4-butanediol, 2-methyl-1,3-propanediol, 2-methyl-1,3-butanediol, 1,5-pentanediol, 2,2-dimethyl-1,3-propanediol, 1,6-hexanediol, 3-methyl-1,5-pentanediol, 1,9-nonanediol, 2-ethyl-2-butylpropanediol (DMH), hydroxypivalic acid neopentyl glycol ester, dimethylolheptane, 2,2,4-trimethyl-1,3-pentanediol, etc. As to examples of the alicyclic glycol, there may be exemplified 1,4-cyclohexanediol, 1,4-cyclohexanedimethanol, tricyclodecane diol, tricyclodecane dimethylol, spiroglycol, hydrogenated bisphenol A, an adduct of hydrogenated bisphenol A with ethylene oxide or with propylene oxide, dimer diol, etc. As to examples of the ether bond-containing glycol, there may be used diethylene glycol, triethylene glycol, dipropylene glycol, polyethylene glycol, polypropylene glycol, polytetramethylene glycol, an addict of neopentyl glycol with ethylene oxide or an adduct of neopentyl glycol with propylene oxide. As to examples of the aromatic-containing glycol, there may be exemplified p-xylene glycol, m-xylene glycol, o-xylene glycol, p-hydroxyphenethyl alcohol, 1,4-phenylene glycol, an adduct of 1,4-phenylene glycol with ethylene oxide, bisphenol A, a glycol prepared by addition of one to several mole(s) of ethylene oxide or propylene oxide to each of two phenolic hydroxyl groups of bisphenols such as an adduct of bisphenol A with ethylene oxide and an adduct of propylene oxide, etc. Also, specific examples of glycol-modified products of aromatic dicarboxylic acids include are bis-2-hydroxyethyl terephthalate (BHET), which is an ethylene glycol-modified product of terephthalic acid, propylene glycol-modified products of terephthalic acid, ethylene glycol-modified products of isophthalic acid, propylene glycol-modified products of isophthalic acid, ethylene glycol-modified products of orthophthalic acid, propylene glycol-modified products of orthophthalic acid, etc. Furthermore, other examples of glycol-modified products of aromatic dicarboxylic acids include glycol-modified products of aromatic dicarboxylic acids having a sulfonic acid group or a sulfonic acid salt group, etc., such as naphthalene dicarboxylic acid, biphenyldicarboxylic acid, diphenic acid, 5-hydroxyisophthalic acid, sulfoterephthalic acid, 5-sulfoisophthalic acid, 4-sulfophthalic acid, 4-sulfonaphthalene-2,7-dicarboxylic acid, 5-(4-sulfophenoxy) isophthalic acid, sulfoterephthalic acid, and/or metal salts thereof and ammonium salts thereof, etc.

The polymer polyester polyol may contain a trifunctional or higher functional polycarboxylic acid component or a trifunctional or higher functional polyol component. As to the trifunctional or higher functional polycarboxylic acid component used for the polymer polyester polyol, there may be exemplified trimellitic acid, trimesic acid, ethylene glycol bis(anhydrotrimellitate), glycerol tris(anhydrotrimellitate), trimellitic anhydride, pyromellitic anhydride (PMDA), oxydiphthalic acid dianhydride (ODPA), 3,3',4,4'-benzophenone tetracarboxylic acid dianhydride (BTDA), 3,3',4,4'-diphenyl-tetracarboxylic acid dianhydride (BPDA), 3,3',4,4'-diphenylsulfone tetracarboxylic acid dianhydride (DSDA), 4,4'-(hexafluoroisopropylidene)diphthalic acid dianhydride (6FDA), 2,2'-bis[(dicarboxyphenoxy)phenyl] propane dianhydride (BSAA), etc. On the other hand, as to the trifunctional or higher functional polyol, there may be exemplified glycerin, trimethylol ethane, trimethylol propane and pentaerythritol, etc.

Another component used for the polymer polyester polyol include oxycarboxylic acid compounds having a hydroxyl group and a carboxy group in a molecular structure, such as 5-hydroxyisophthalic acid, p-hydroxybenzoic acid, p-hydroxyphenylpropionic acid, p-hydroxyphenylacetic acid, 6-hydroxy-2-naphthoic acid, and 4,4-bis(p-hydroxyphenyl) valeric acid can also be used.

The polymer polyol (a) may be configured to contain two or more polymer polyols including a polymer polyol (a1) having a number average molecular weight of 7,000 or higher and a polymer polyol (a2) having a number average molecular weight of 1,000 or higher and lower than 7,000. The above configuration can further improve the heat resistance. That is, while the long-chain molecules of the long-chain polymer polyol (a1) block contributes to the heat resistance, a sufficient amount of carboxylic acid to impart heat resistance can be introduced by introducing the short-chain polymer polyol (a2) block.

As for the copolymerization ratio between the polymer polyol (a1) and the polymer polyol (a2) in the polyester resin (A) having a carboxy group on a side chain, the amount of the polymer polyol (a2) is preferably 5 parts by mass or larger, more preferably 10 parts by mass or larger, and further preferably 20 parts by mass or larger per 100 parts by mass of the total amount of the polymer polyol (a1) and the polymer polyol (a2). In addition, the amount of the polymer polyol (a2) is preferably 50 parts by mass or smaller, more preferably 40 parts by mass or smaller, and further preferably 30 parts by mass or smaller. When the copolymerization ratio between the polymer polyol (a1) and the polymer polyol (a2) is set within the above range, the heat resistance can be made better.

The copolymerization amount of the polymer polyol (a1) in the polyester resin (A) having a carboxy group on a side chain is preferably 50% by mass or larger, more preferably 60% by mass or larger, and further preferably 70% by mass or larger. In addition, the copolymerization amount of the polymer polyol (a1) is preferably 90% by weight or smaller, more preferably 85% by mass or smaller, and further preferably 80% by mass or smaller. When the copolymerization amount of the polymer polyol (a1) is in the above range, the heat resistance and adhesion become good due to the balance between the copolymerization amounts of the polymer polyol (a2) and the trivalent or higher polycarboxylic acid component.

<Trivalent or Higher Polycarboxylic Acid Component>

The trivalent or higher polycarboxylic acid component reacted (copolymerized) with the polymer polyol (a) is not particularly limited as long as the polycarboxylic acid component is a compound having three or more carboxy groups in a molecule. The carboxy groups may form an acid anhydride group in the molecule, and in this case, one acid anhydride group is counted as two carboxy groups. As to the trivalent or higher polycarboxylic acid component, there may be exemplified trimellitic acid, trimesic acid, ethylene glycol bis(anhydrotrimellitate), glycerol tris(anhydrotrimellitate), trimellitic anhydride, pyromellitic anhydride (PMDA), oxydiphthalic acid dianhydride (ODPA), 3,3',4,4'-benzophenone tetracarboxylic acid dianhydride (BTDA), 3,3',4,4'-diphenyl-tetracarboxylic acid dianhydride (BPDA), 3,3',4,4'-diphenylsulfone tetracarboxylic acid dianhydride (DSDA), 4,4'-(hexafluoroisopropylidene)diphthalic acid dianhydride (6FDA). 2,2'-bis[(dicarboxyphenoxy)phenyl] propane dianhydride (BSAA), etc.

As for the copolymerization ratio between the polymer polyol (a) and the trivalent or higher polycarboxylic acid component in the polyester resin (A) having a carboxy group on a side chain, the amount of the trivalent or higher polycarboxylic acid component is preferably 0.5 parts by mass or larger, more preferably 1 part by mass or larger, and further preferably 2 parts by mass or larger per 100 parts by mass of the polymer polyol (a). In addition, the amount of the trivalent or higher polycarboxylic acid component is preferably 10 parts by mass or smaller, more preferably 8 parts by mass or smaller, and further preferably 5 parts by mass or smaller. When the copolymerization ratio of the trivalent or higher polycarboxylic acid component is the above lower limit or larger, the amount of crosslinking becomes sufficient, resulting in improved heat resistance. In addition, when the copolymerization ratio of the trivalent or higher polycarboxylic acid component is the above upper limit or smaller, the crosslink density does not become excessively high, ester bond exchange is likely to occur, and softening becomes sufficient, resulting in improved adhesion.

<Chain Extender>

For the polyester resin (A) having a carboxy group on a side chain, a chain extender can be optionally used as a copolymerization component in addition to the polymer polyol (a1), the polymer polyol (a2), and the trivalent or higher polycarboxylic acid component as long as the above-described effects are not impaired. The use of a chain extender can efficiently impart an acid value. The copolymerization amount in the case of using a chain extender is preferably 0.1 parts by mass or larger, more preferably 0.5 parts by mass or larger, and further preferably 1 part by mass or larger per 100 parts by mass of the polymer polyol (a). In addition, the copolymerization amount is preferably 5 parts by mass or smaller, more preferably 4 parts by mass or smaller, and further preferably 3 parts by mass or smaller. If the copolymerization amount is excessively large, phenomena in which the molecular weight is less likely to be increased, the reaction between chain extenders proceeds and varnish becomes cloudy, etc., may occur.

The chain extender is preferably a low molecular weight diol having a molecular weight of 1000 or lower, and examples of the chain extender include 2,2-dimethyl-1,3-propanediol, dimethylolbutanoic acid, etc. These chain extenders can be used individually, or two or more of these chain extenders can be used in combination. Among them, from the viewpoint of solubility and compatibility, 2,2-dimethyl-1,3-propanediol is preferable.

For the polyester resin (A) having a carboxy group on a side chain, a quaternary ammonium salt or a tertiary amine may be used as a reaction catalyst as long as the above-described effects are not impaired. Examples of the quaternary ammonium salt and the tertiary amine include: imidazole compounds such as 2-methylimidazole, 1,2-dimethylimidazole, 2-ethyl-4-methylimidazole, 2-phenyl-4-methylimidazole, and 1-cyanoethyl-2-ethyl-4-methylimidazole; tertiary amines such as triethylamine, triethylenediamine, N'-methyl-N-(2-dimethylaminoethyl)piperazine, N,N-diisopropylethylamine, N,N-dimethylaminopyridine, 1,8-diazabicyclo(5,4,0)-undecen-7, 1,5-diazabicyclo(4,3,0)-nonen-5, and 6-dibutylamino-1,8-diazabicyclo(5,4,0)-undecen-7, and compounds obtained by making these tertiary amines with phenol, octyl acid, quaternized tetraphenylborate salts, etc., into amine salts; and quaternary ammonium salts such as tetramethylammonium bromide, tetraethylammonium bromide, tetra-n-butylammonium bromide, tetramethylammonium chloride, trimethylbenzylammonium chloride, triethylbenzylammonium chloride, tetramethylammonium hydroxide, trimethylbenzylammonium hydroxide, and tetra-n-butylammonium hydroxide.

<Epoxy Compound (B)>

The epoxy compound (B) is not particularly limited and is preferably a compound having two or more epoxy groups in a molecule. The compound (epoxy crosslinking agent) having two or more epoxy groups in a molecule is not particularly limited as long as the compound causes a curing reaction with the carboxy group of the polyester resin (A) to perform crosslinking. By using the polyfunctional epoxy compound, three-dimensional crosslinks are easily formed in a cured coating film obtained from the crosslinked aromatic polyester resin composition, so that it is possible to improve heat resistance.

Other epoxy compound can also be used in combination as an epoxy compound (B). Examples of the other epoxy compound may be a glycidyl ether type such as bisphenol A diglycidyl ether, bisphenol S diglycidyl ether, bromized bisphenol A diglycidyl ether, a glycidyl ester type such as hexahydrophthalic glycidyl ester and dimer acid glycidyl ester, or alicyclic or aliphatic epoxide such as triglycidyl isocyanurate, 3,4-epoxy cyclohexyl methyl carboxylate, epoxidized polybutadiene and epoxidized soybean oil. One or more member(s) can be selected therefrom.

From the viewpoint of crosslink density, the epoxy compound (B) has a number average molecular weight of preferably 100 or more and 500 or less, and more preferably 200 or more and 400 or less.

<Crosslinked Polyester Resin (C)>

The crosslinked polyester resin (C) is a reaction product of the polyester resin (A) and the epoxy compound (B). In addition, the crosslinked polyester resin (C) satisfies at least one of the following requirements: (1) a transesterification catalyst (D) is contained; and (2) the epoxy compound (B) is an epoxy amine compound (E) having a tertiary amino group. That is, the crosslinked polyester resin (C) has a configuration (1) and/or (2). The reaction between the polyester resin (A) having a carboxy group on a side chain and the epoxy compound (B) may be carried out under a solvent-free condition or may be carried out in the presence of an organic solvent. The organic solvent is not particularly limited as long as the organic solvent does not react with the polyester resin (A), the epoxy compound (B), and the crosslinked polyester resin (C), and examples of the organic solvent include aromatic organic solvents such as toluene and xylene, aliphatic organic solvents such as heptane and octane, ether solvents such as tetrahydrofuran and diethyl ether, ether-based solvents such as tetrahydrofuran and diethyl ether, and amide-based solvents such as dimethylformamide and N-methylpyrrolidone. These organic solvents can be used individually, or two or more of these organic solvents can be used in combination.

A reaction temperature of the reaction is preferably 80° C. or more, more preferably 100° C. or more, and further preferably 120° C. or more. In addition, the reaction temperature is preferably 200° C. or lower, more preferably 180° C. or lower, and further preferably 160° C. or lower.

A reaction time depends on the reaction temperature and is preferably 30 minutes or longer, more preferably 1 hour or longer, and further preferably 2 hours or longer. In addition, the reaction time is preferably 10 hours or shorter, more preferably 8 hours or shorter, and further preferably 5 hours or shorter.

The amount ratio between the polyester resin (A) having a carboxy group on a side chain and the epoxy compound (B) in the crosslinked polyester resin (C) can be determined based on the functional group molar ratio between the carboxy group on the side chain of the polyester resin (A) having a carboxy group and the epoxy group of the epoxy compound (B). From the viewpoint of crosslinking reaction efficiency and stress relaxation in the crosslinked polyester (C) after crosslinking, the ratio of the carboxy group of the polyester resin (A) to the epoxy group of the epoxy compound (B) (carboxy group:epoxy group) is preferably 100:50 to 100:150 (parts by mole) and more preferably 100:80 to 100:120 (parts by mole).

As an example of a method for producing the crosslinked polyester resin (C), the crosslinked polyester resin (C) can be obtained by heating a mixture of the polyester resin (A) having a carboxy group on a side chain, the epoxy compound (B), and the transesterification catalyst (D) and performing a crosslinking reaction via an epoxy ring-opening reaction. Alternatively, the crosslinked polyester resin (C) can be obtained by heating a mixture of the polyester resin (A) having a carboxy group on a side chain and the epoxy amine compound (E) having a tertiary amino group and performing a crosslinking reaction via an epoxy ring-opening reaction.

The crosslinked polyester resin (C) has a stress relaxation initiation temperature of preferably 100° C. or higher, more preferably 110° C. or higher, and further preferably 120° C. or higher. The upper limit thereof is not particularly limited, but is industrially preferably 300° C. or lower and may be 250° C. or lower.

For the crosslinked polyester resin (C), a time for which a relaxation modulus reaches 0.37 times as much as an initial relaxation modulus when measured at a shear strain of 10% and 180° C. with a vertical stress of 0.1 N applied using a rheometer needs to be $1\times10^{1}$ seconds to $1\times10^{4}$ seconds. When the time for which the relaxation modulus reaches 0.37 times as much as the initial relaxation modulus when measured at 180° C. is $1\times10^{4}$ seconds or shorter, the crosslinked polyester resin exhibits appropriate stress relaxation, which can prevent a problem of warpage due to curing shrinkage, and a problem of occurrence of cracks or circuit distortion due to the difference in thermal expansion between different layers when an insulating film is laminated on a metal substrate via an adhesive agent or when semiconductor devices are mounted on a substrate for semiconductor mounting. In addition, when the time is $1\times10^{1}$ seconds or longer, flow-out can be suppressed when the crosslinked polyester resin is used as an adhesive agent. The time for which the relaxation modulus reaches 0.37 times as much as the initial relaxation modulus is preferably $2\times10^{3}$ seconds or shorter, more preferably $1\times10^{3}$ seconds or shorter, and further preferably $5\times10^{2}$ seconds or shorter. In addition, the time is preferably $5\times10^{1}$ seconds or longer and more preferably $1\times10^{2}$ seconds or longer. As a method for adjusting the time within this range, the time can be adjusted, for example, by the crosslink density of the crosslinked polyester resin (C) and a transesterification reaction rate, and a specific example of such a method is a method in which the time is adjusted by the acid value of the polyester resin (A) having a carboxy group on a side chain, the types and the reaction ratio of the epoxy compound (B) and the epoxy amine compound (E) having a tertiary amino group, the content of the transesterification catalyst (D), etc.

The crosslinked polyester resin (C) preferably has an elastic modulus of 0.1 MPa or higher and 1.2 MPa or lower at a temperature equal to or higher than the stress relaxation initiation temperature thereof. The elastic modulus is more preferably 0.15 MPa or higher and further preferably 0.2 MPa or higher. In addition, the elastic modulus is more preferably 1.0 MPa or lower and further preferably 0.8 MPa or lower. When the elastic modulus at a temperature equal to or higher than the stress relaxation initiation temperature is in the above range, the crosslinked polyester resin (C) closely adheres to a base material and enters the irregularities of the surface of the base material when being used as an adhesive sheet, whereby the adhesive strength can be improved and excellent dielectric breakdown reliability can be exhibited. As a method for adjusting the elastic modulus within the above range, the elastic modulus can be adjusted, for example, by the crosslink density of the crosslinked polyester resin (C) and a transesterification reaction rate, and a specific example of such a method is a method in which the elastic modulus is adjusted by the acid value of the polyester resin (A) having a carboxy group on a side chain, the types and the reaction ratio of the epoxy compound (B) and the epoxy amine compound (E) having a tertiary amino group, the content of the transesterification catalyst (D), etc.

Here, the elastic modulus refers to the value of a storage elastic modulus (E') at a temperature at which stress relaxation begins to occur, when the storage elastic modulus (E') is determined by using a dynamic viscoelasticity measuring device under a measurement temperature between −100° C. and 250° C. at a frequency of 1 Hz.

<Transesterification Catalyst (D)>

The transesterification catalyst (D) is a transesterification catalyst for the ester group in the polyester resin (A). By the transesterification catalyst (D), "dynamic" covalent crosslinks allowing bond exchange at high temperatures are formed in the crosslinked polyester resin, whereby the crosslinked polyester resin has high strength at room temperature, and is capable of adhering to a base material or film at an ester bond exchange activation temperature thereof or higher. In addition, stress relaxation is exhibited, which can prevent a problem of cracks or circuit distortion due to the difference in thermal expansion between an insulating layer and a conductor layer.

Examples of the transesterification catalyst (D) include zinc acetate, triphenylphosphine, 1,5,7-triazabicyclo[4.4.0]deca-5-ene, 1,8-diazabicyclo[5.4.0]undecen-7, etc. Among them, zinc acetate is preferable.

From the viewpoint of mechanical strength of the polyester resin (A) having a carboxy group on a side chain and uniformity of a sample and from the viewpoint of the stress relaxation in the crosslinked polyester (C) after crosslinking, the content of the transesterification catalyst (D) in the crosslinked polyester resin (C) per 100 parts by mole of the carboxy group of the polyester resin (A) having a carboxy group on a side chain is preferably 10 parts by mole to 40 parts by mole, and more preferably 10 parts by mole to 30 parts by mole.

<Epoxy Amine Compound (E) Having Tertiary Amino Group>

The epoxy compound (B) in the crosslinked polyester resin (C) may be an epoxy amine compound (E) having a tertiary amino group in a molecule. The tertiary amino group of the epoxy amine compound (E) having a tertiary amino group in a molecule has the same transesterification catalyst action as the transesterification catalyst (D), and by heating the crosslinked polyester resin (C), the hydroxyl group contained in the crosslinked polyester resin (C) attacks the C—O bond of the ester group existing in the vicinity of the hydroxyl group due to the action of the tertiary amino group even without containing the transesterification catalyst (D), and bond exchange by a transesterification reaction occurs, so that stress relaxation behavior can be exhibited.

Examples of the epoxy amine compound (E) include N,N,N',N'-tetraglycidyl-m-xylenediamine, 4,4'-methylenebis(N,N-diglycidylaniline), triglycidyl para-aminophenol, etc. N,N,N',N'-tetraglycidyl-m-xylenediamine is commercially available from MITSUBISHI GAS CHEMICAL COMPANY, INC., as a multifunctional epoxy compound "TETRAD-X". Triglycidyl para-aminophenol is commercially available from Mitsubishi Chemical Corporation as "jER630". 4,4'-methylenebis(N,N-diglycidylaniline) is available from Tokyo Chemical Industry Co., Ltd. (TCI). The epoxy amine compound (E) having a tertiary amino group preferably has a plurality of tertiary amino groups in one molecule, and specifically, N,N,N',N'-tetraglycidyl-m-xylylenediamine and 4,4'-methylenebis(N,N-diglycidylaniline) are preferable. When the epoxy amine compound (E) has a plurality of tertiary amino groups in one molecule, it is easier to exhibit a transesterification catalyst action and it is easier to exhibit stress relaxation behavior. As the epoxy amine compound (E) having a tertiary amino group, one epoxy amine compound may be used, or two or more epoxy amine compounds may be used. In addition, the epoxy amine compound (E) having a tertiary amino group may be used in combination with an epoxy compound having no tertiary amino group. It is also preferable to use the epoxy amine compound (E) having a tertiary amino group in combination with the transesterification catalyst (D).

The epoxy amine compound (E) having a tertiary amino group preferably has a molecular weight of 800 or less. When the molecular weight is 800 or less, the epoxy amine compound can easily enter between polyester chains to form three-dimensional crosslinks, so that heat resistance can be improved. The molecular weight of the epoxy amine compound (E) having a tertiary amino group is more preferably 700 or less, and further preferably 600 or less. The lower limit of the molecular weight of the epoxy amine compound is, for example, 250 or more.

As for the amount ratio of the epoxy amine compound (E) having a tertiary amino group in the crosslinked polyester resin (C), the amount of the epoxy amine compound (E) having a tertiary amino group is preferably 3 to 40 parts by mole per 100 parts by mole of the carboxy group of the polyester resin (A) having a carboxy group on a side chain. The amount of the epoxy amine compound (E) having a tertiary amino group is more preferably 5 parts by mole or larger and further preferably 10 parts by mole or larger. In addition, the amount of the epoxy amine compound (E) having a tertiary amino group is more preferably 35 parts by mole or smaller and further preferably 30 parts by mole or smaller. When the amount ratio of the epoxy amine compound (E) having a tertiary amino group in the crosslinked polyester resin (C) is set within the above range, the crosslink density is appropriate, and stress relaxation can be exhibited in the crosslinked polyester (C) after crosslinking.

<Adhesive Sheet>

The crosslinked polyester resin (C) described above can be suitably used as an adhesive sheet. An adhesive sheet according to the embodiment only has to have an adhesive layer made of the crosslinked polyester resin (C), and may be an adhesive sheet having two or more layers including another layer such as a base material layer and a release layer, or may be a single-layer adhesive sheet obtained by processing the crosslinked polyester resin (C) itself into a sheet shape. The adhesive sheet according to the embodiment may have two or more layers each of which is an adhesive layer made of the crosslinked polyester resin (C).

Examples of a method for producing the adhesive sheet according to the embodiment include a hot melt coating method in which the crosslinked polyester resin (C) is heated and stirred, and is extruded onto a release treated film, a method in which a polyester resin mixture before crosslinking is dissolved in a solvent and applied to a release treated film, then the solvent is dried, and crosslinking is then performed, and a method in which a polyester resin mixture before crosslinking is stirred at a high speed in water or a solvent to obtain a water dispersion, the water dispersion is applied to a release treated film, the water is dried, and crosslinking is then performed. Also, by laminating a release base material, the adhesive sheet can serve as a protective layer for a base material, and by using a release base material, the release base material can be released from the adhesive sheet, and the adhesive agent layer can be further transferred to another base material.

The adhesive sheet can be obtained by applying the crosslinked polyester resin (C) to various laminates and drying the crosslinked polyester resin (C) according to the usual method. In addition, when a release base material is attached to the adhesive agent layer after drying, winding is enabled without back-transfer to the base material, resulting in excellent operability, and the adhesive agent layer is protected, resulting in excellent preservation and ease of use. In addition, after application to the release base material and drying, when another release base material is attached, if necessary, it is also made possible to transfer the adhesive agent layer itself to the other base material.

The release base material is not particularly limited, and examples thereof include paper, such as fine paper, kraft paper, rolled paper, and glassine paper, both sides of which are each provided with a coating layer of a sealer such as clay, polyethylene, and polypropylene to which a silicone, fluorine, or alkyd-based release agent is further applied. In addition, examples of the release base material also include various olefin films such as polyethylene, polypropylene, ethylene-α-olefin copolymer, and propylene-α-olefin copolymer films, and films of polyethylene terephthalate, polyethylene naphthalate, etc., coated with the above release agent. For reasons such as the release strength between the release base material and the adhesive agent layer and the adverse effect of silicone on electrical properties, fine paper whose both sides are sealed with polypropylene on which an alkyd-based release agent is used, or polyethylene terephthalate on which an alkyd-based release agent is used, is preferable.

The method for coating an adhesive agent composition on the base material is not particularly limited, and examples thereof include methods with a comma coater, a reverse roll coater, etc. Alternatively, if necessary, an adhesive agent layer can be provided directly or by a transfer method on a rolled copper foil, which is a printed wiring board constituent material, or a polyimide film. The thickness of the adhesive agent layer after drying is changed as appropriate, if necessary, and is preferably in the range of 5 to 200 μm. When the thickness of the adhesive film is set to be 5 μm or larger, sufficient adhesive strength is obtained.

<Printed Wiring Board>

A "printed wiring board" according to the embodiment includes, as a component, a laminate formed from a resin base material and a metal foil forming a conductor circuit. The printed wiring board is produced, for example, by a conventionally known method such as a subtractive method using a metal-clad laminate. The printed wiring board is a general term for so-called flexible circuit boards (FPCs) in which a conductor circuit formed by a metal foil is partially or fully covered with a cover film, screen printing ink, or the like, if necessary, flat cables, and circuit boards for tape automated bonding (TAB).

The printed wiring board can have any laminate configuration that can be employed for a printed wiring board. For example, the printed wiring board can be a printed wiring board composed of four layers, that is, a base material film layer, a metal foil layer, an adhesive agent layer, and a cover film layer. Also, for example, the printed wiring board can be a printed wiring board composed of five layers, that is, a base material film layer, an adhesive agent layer, a metal foil layer, an adhesive agent layer, and a cover film layer.

Furthermore, if necessary, a configuration in which two or three or more of printed wiring boards each which is the above printed wiring board are stacked together can be employed.

The base material is not particularly limited as long as the crosslinked polyester resin (C) can be applied thereto and dried to form an adhesive agent layer or an adhesive sheet produced from the crosslinked polyester resin (C) can be attached and laminated thereon. Examples of the base material include resin base materials such as film-shaped resins, metal base materials such as metal plates and metal foils, paper, etc.

Examples of resin base materials include polyester resins, polyamide resins, polyimide resins, polyamide-imide resins, liquid crystal polymers, polyphenylene sulfide, syndiotactic polystyrene, polyolefin-based resins, fluorine-based resins, etc. A film-shaped resin (hereinafter also referred to as base material film layer) is preferable.

As a metal base material, any conventionally known conductive material that can be used for a circuit board can be used. Examples of the material include various metals such as SUS, copper, aluminum, iron, steel, zinc, and nickel, alloys and plated products thereof, metals treated with other metals such as zinc and chromium compounds, etc. A metal foil is preferable, and a copper foil is more preferable. As the copper foil, any foil produced by a rolling method or an electrolysis method can be used. The metal foil may be subjected to a physical surface treatment such as roughening or a chemical surface treatment such as acid cleaning for the purpose of ensuring an adhesive force with a crosslinked polyester resin composition layer. The thickness of the metal foil is not particularly limited, but is preferably 1 μm or larger, more preferably 3 μm or larger, and further preferably 10 μm or larger. In addition, the thickness of the metal foil is preferably 50 μm or smaller, more preferably 30 μm or smaller, and further preferably 20 μm or smaller. If the thickness is excessively small, it may be difficult to obtain sufficient electrical performance of the circuit. On the other hand, if the thickness is excessively large, processing efficiency and the like during circuit production may be reduced. The metal foil is usually supplied in the form of a roll. The form of the metal foil used in the production of the printed wiring board is not particularly limited. In the case of using a metal foil in the form of a ribbon, the length thereof is not particularly limited. In addition, the width thereof is also not particularly limited, but is preferably about 250 to 500 cm. The surface roughness of the base material is not particularly limited, but is preferably 3 μm or smaller, more preferably 2 μm or smaller, and further preferably 1.5 μm or smaller. For practical use, the surface roughness is preferably 0.3 μm or larger, more preferably 0.5 μm or larger, and further preferably 0.7 μm or larger. In addition, the surface roughness is preferably 3 μm or smaller, more preferably 2 μm or smaller, and further preferably 1.5 μm or smaller.

Examples of paper include fine paper, kraft paper, rolled paper, glassine paper, etc. Examples of composite materials include glass epoxy, etc.

From the viewpoint of durability and an adhesive force with the crosslinked polyester resin (C), a polyester resin, a polyamide resin, a polyimide resin, a polyamide-imide resin, a liquid crystal polymer, polyphenylene sulfide, syndiotactic polystyrene, a polyolefin-based resin, a fluorine-based resin, a SUS steel sheet, a copper foil, an aluminum foil, or glass epoxy is preferable as the base material.

<Coverlay Film>

A coverlay film according to the embodiment is a film having an adhesive agent layer made of the crosslinked polyester resin (C) and an insulating film, and is, for example, a film that serves to protect a member such as the above printed wiring board and a circuit. As the insulating film, any conventionally known insulating film for a printed wiring board can be used. For example, films produced from various polymers, such as polyimide, polyester, polyphenylene sulfide, polyethersulfone, polyether ether ketone, aramid, polycarbonate, polyarylate, polyamide-imide, liquid crystal polymers, syndiotactic polystyrene, and polyolefin-based resins, can be used.

<Method for Producing Printed Wiring Board>

As an example of a method for producing the printed wiring board according to the embodiment, the printed wiring board can be produced by an attaching and heating step conducted at a temperature equal to or higher than the stress relaxation initiation temperature of the crosslinked polyester resin (C). That is, for example, the materials of the respective layers described above are stacked on each other, and are heated at a temperature equal to or higher than the stress relaxation initiation temperature of the crosslinked polyester resin (C) to be attached to each other, whereby each member can be laminated without performing a curing treatment due to the properties of the crosslinked polyester resin (C), and the printed wiring board can be obtained.

In a preferred embodiment, a product in which a crosslinked polyester resin composition layer is laminated on a coverlay film layer (hereinafter referred to as "coverlay film-side product") is produced. Meanwhile, a product in which a metal foil layer is laminated on a base material film layer and a desired circuit pattern is formed (hereinafter referred to as "base material film-side two-layer product") or a product in which a crosslinked polyester resin composition layer is laminated on a base material film layer, a metal foil layer is laminated thereon, and a desired circuit pattern is formed (hereinafter referred to as "base material film-side three-layer product") is produced (hereinafter, the base material film-side two-layer product and the base material film-side three-layer product are collectively referred to as "base material film-side product"). By attaching the coverlay film-side product and base material film-side product thus obtained to each other, a four-layer or five-layer printed wiring board can be obtained.

Conventionally known methods can be used to form the circuit in the metal foil layer. An additive method may be used, or a subtractive method may be used. The subtractive method is preferable.

For example, in the case of a soft and windable reinforcing material such as a polyimide film, a reinforcing material-side product is suitable to be produced by applying an adhesive agent to the reinforcing material. In addition, for example, in the case of a stiff and unwindable reinforcing plate such as metal plates of SUS, aluminum, etc., a plate obtained by curing glass fibers with an epoxy resin, or the like, a reinforcing material-side product is suitable to be produced by transfer application of an adhesive agent applied in advance to a release base material. If necessary, a crosslinking reaction in the applied adhesive agent can be performed.

The obtained reinforcing material-side product may be used to be attached to the back surface of the printed wiring board as it is, or may be used to be attached to the base material film-side product after a release film is attached thereto and stored.

The base material film-side product, the coverlay film-side product, and the reinforcing material-side product are all included in a laminate for a printed wiring board according to the embodiment.

<Laminate>

A wiring board according to the embodiment is a board obtained by laminating the crosslinked polyester resin (C) on a base material (two-layer laminate of base material/adhesive agent layer), or a board obtained by further attaching a base material (three-layer laminate of base material/adhesive agent layer/base material). Here, the adhesive agent layer refers to a layer of the adhesive agent composition after the adhesive agent composition is applied to the base material and dried, or a layer of the adhesive agent composition after an adhesive sheet produced from the crosslinked polyester resin is attached to the base material and laminated.

The present application claims priority based on Japanese Patent Application No. 2021-168544 filed on Oct. 14, 2021. All the contents described in Japanese Patent Application No. 2021-168544 filed on Oct. 14, 2021, are incorporated herein by reference.

EXAMPLES

Hereinafter, the present invention will be more specifically described by means of examples and comparative examples. However, the present invention is not limited by the following examples. Each of the measurements listed in the examples and comparative examples were made by the following methods. Unless otherwise specified, "part" means "mass part" and "mole" means "molar part".

Polymerization Example of Polymer Polyol (A1-1)

To a reaction vessel equipped with a stirrer, a thermometer, and a distillation cooler, 30 mole of terephthalic acid, 69 mole of isophthalic acid, 1 mole of trimellitic anhydride, 15 mole of 2-methyl-1,3-butanediol, 85 mole of 1,6-hexanediol, and 0.2 mole of tetrabutyl titanate were added, the temperature of the mixture was gradually increased to 250° C., and an esterification reaction was carried out while removing distilled water from the system. After the esterification reaction was completed, initial polymerization was carried out while gradually reducing the pressure to 10 mmHg, the temperature was increased to 250° C., and late polymerization was further carried out at 1 mmHg or lower until a predetermined torque was reached. Thereafter, the pressure was returned to normal pressure by nitrogen, 1 part by mole of trimellitic anhydride was added, and a reaction was carried out at 220° C. for 30 minutes to obtain a polymer polyol (A1-1). The composition and property values of the polymer polyol (A1-1) thus obtained are shown in Table 1.

Polymerization Example of Polymer Polyol (A1-2)

To a reaction vessel equipped with a stirrer, a thermometer, and a distillation cooler, 50 mole of terephthalic acid, 50 mole of isophthalic acid, 55 mole of ethylene glycol, 45 mole of 2,2-dimethyl-1,3-propanediol, and 0.2 mole of tetrabutyl titanate were added, the temperature of the mixture was gradually increased to 250° C., and an esterification reaction was carried out while removing distilled water from the system. After the esterification reaction was completed, initial polymerization under reduced pressure was carried out while gradually reducing the pressure to 10 mmHg, the temperature was increased to 250° C., and late polymerization was further carried out at 1 mmHg or lower until a predetermined torque was reached to obtain a polymer polyol (A1-2). The composition and property values of the polymer polyol (A1-2) thus obtained are shown in Table 1.

Polymer polyols (A1-3 to A1-4) were obtained in the same manner as the polymer polyol (A1-1), except that the types and the amount ratio of the raw materials were changed as shown in Table 1. The properties of these polymer polyols are shown in Table 1.

<Number Average Molecular Weight (Mn)>

Each sample [polymer polyols (A), polyester resins (A) having a carboxy group on a side chain] was dissolved or diluted in tetrahydrofuran such that the sample concentration was about 0.5% by mass, and the resulting solution was filtered through a polytetrafluoroethylene membrane filter having a pore diameter of 0.5 μm to obtain a filtrate as a sample for measurement. The number average molecular weight was measured by gel permeation chromatography using tetrahydrofuran as a mobile phase and a differential refractometer as a detector. The flow rate was set to 1 mL/min, and the column temperature was set to 30° C. Monodisperse polystyrene was used as a molecular weight standard. The number average molecular weight was calculated by omitting the portion of the molecular weight corresponding to less than 1000.

<Acid Value>

Each sample [polymer polyols (A1), polyester resins (A) having a carboxy group on a side chain] of 0.2 g was dissolved in 20 ml of chloroform, and titration was performed with a 0.1 N potassium hydroxide (KOH) ethanol solution using phenolphthalein as an indicator. From the titer, the acid value (mg KOH/g) was calculated by converting the number of mg of KOH consumed for the neutralization into the amount per 1 g of the resin.

<Glass Transition Temperature>

To a differential scanning calorimeter "DSC220 model" manufactured by Seiko Instruments Inc., 5 mg of each sample [polymer polyols (A1), polyester resins (A) having a carboxy group on a side chain] was added in an aluminum pan, and the pan was sealed by pressing a lid thereon, and held at 250° C. for 5 minutes once. Then, the pan was rapidly cooled by liquid nitrogen, and then measurement was performed from −100° C. to 300° C. at a temperature increase rate of 20° C./min. The inflection point of the obtained curve was defined as a glass transition temperature.

TABLE 1

| | Component | Name of substance | A1-1 | A1-2 | A1-3 | A1-4 |
|---|---|---|---|---|---|---|
| Composition (mole %) | Polycarboxylic acid component | terephthalic acid | 30 | 50 | 40 | 50 |
| | | isophthalic acid | 69 | 50 | 39 | 49 |
| | | adipic acid | | | 20 | |
| | | trimellitic anhydride | 1 | | 1 | 1 |
| | Polyalcohol component | ethylene glycol | | 55 | | |
| | | 2,2-dimethyl-1,3-propanediol | | 45 | | |
| | | 2-methyl-1,3-butanediol | 15 | | 58 | 83 |
| | | 1,4-butanediol | | | 42 | 17 |
| | | 1,6-hexanediol | 85 | | | |
| | Addition acid | trimellitic anhydride | 1 | | 1 | 1 |
| Property | Number average molecular weight (Mn) | | 15000 | 3000 | 12000 | 12000 |
| | Acid value (mgKOH/g) | | 5.1 | 0.3 | 6.5 | 5.6 |
| | Glass transition temperature (° C.) | | 7 | 55 | 10 | 40 |

Example of Synthesis of Polyester Resin (A-1) Having a Carboxy Group on a Side Chain To a reaction vessel equipped with a stirrer, a thermometer, and a reflux tube, 80 parts of the polymer polyol (A1-1), 20 parts of the polymer polyol (A1-2), 2.6 parts of pyromellitic dianhydride, and 100 parts of toluene were added, and the mixture was dissolved in toluene while gradually increasing the temperature of the mixture to 80° C. After the dissolution was completed, 0.05 parts of triethylamine was added as a reaction catalyst, then the temperature of the mixture was gradually increased to 105° C., and a reaction was carried out for 24 hours. After the completion of the reaction was confirmed by infrared spectroscopy (IR), 54 parts of toluene was added to dilute the solution to obtain a solution in which the solid concentration of an polyester resin (A-1) having a carboxy group on a side chain was 40% by mass. The composition and property values of the polyester resin (A-1) having a carboxy group on a side chain thus obtained are shown in Table 2.

Synthesis Examples of Polyester Resins (A-2 and A-3) Having Carboxy Group on Side Chain Polyester resins (A-2 and A-3) having a carboxy group on a side chain were obtained in the same manner as the polyester resin (A-1) having a carboxy group on a side chain.

TABLE 2

| Polyester resin (A) having a carboxy group | | | A-1 | A-2 | A-3 |
|---|---|---|---|---|---|
| Composition (parts by mass) | Polymer polyol (a1) | A1-1 | 80 | 80 | |
| | | A1-3 | | | 90 |
| | Polymer polyol (a2) | A1-2 | 20 | 20 | |
| | Tetracarboxylic dianhydride | pyromellitic anhydride | 2.6 | 4.3 | 19.6 |
| | Chain extender | 2,2-dimethyl-1,3-propanediol | | 1 | 10 |
| Property | Number average molecular weight (Mn) | | 16000 | 15000 | 12000 |
| | Acid value (mgKOH/g) | | 17 | 26 | 91 |
| | Glass transition temperature (° C.) | | 15 | 15 | 10 |

Production Example of Crosslinked Polyester Resin Film

A film-shaped crosslinked polyester resin (crosslinked polyester resin film) was produced as follows. A single-film sample (film sample 1) and a polyimide film/crosslinked polyester resin laminate sample (film sample 2) were produced and used for each evaluation described later.

(Method for Producing Single-Film Sample (Film Sample 1))

The polyester resin (A) having a carboxy group on a side chain and the epoxy compound (B) were dissolved in NMP (N-methyl-2-pyrrolidone) such that the amount (molar equivalent) of the carboxy group of the polyester resin (A) having a carboxy group on a side chain and the amount (molar equivalent) of the epoxy group of the epoxy compound (B) had a specific amount ratio, to obtain a resin solution having a solid content of 35% by mass. Next, a transesterification catalyst (zinc acetate; $Zn(OAc)_2$) was separately dissolved in NMP (N-methyl-2-pyrrolidone) to obtain a catalyst solution having a solid content of 35% by mass. These two solutions were mixed in a Teflon (registered trademark) mold such that the amount (molar equivalent) of the carboxy group of the polyester resin (A) having a carboxy group on a side chain and the amount (molar equivalent) of the transesterification catalyst had a specific amount ratio (hereinafter referred to as pre-crosslinking polyester resin composition), and then the solvent was volatilized at 80° C. on a heater. The mixed sample was sequentially heated at 130° C. for 1 hour, 140° C. for 1 hour, and 150° C. for 3 hours to obtain a single-film sample (thickness: 0.7 mm). This single-film sample was regarded as the film sample 1.

(Method for Producing Polyimide Film/Crosslinked Polyester Resin Laminate Sample (Film Sample 2))

A resin solution and a catalyst solution were prepared by the same method as in the above film sample 1, and these two solutions were mixed such that the amount (molar equivalent) of the carboxy group of the polyester resin (A) having a carboxy group on a side chain and the amount (molar equivalent) of the transesterification catalyst had a specific amount ratio, to obtain a dissolved product. The dissolved product was applied to a polyimide film having a thickness of 12.5 μm ("APICAL" (registered trademark), manufactured by KANEKA CORPORATION) such that the thickness of a crosslinked polyester resin layer after drying was 25 μm, was dried at 40° C. for 30 minutes, and was then sequentially dried at 130° C. for 1 hour, 140° C. for 1 hour, and 150° C. for 3 hours to obtain a polyimide film/cross-linked polyester resin laminate sample. This polyimide film/crosslinked polyester resin laminate sample was regarded as the film sample 2.

The following were used as the epoxy compound (B) and the transesterification catalyst (D).

B-1:1,4-butanediol diglycidyl ether (number of epoxy groups: 2)

B-2: "jER630" manufactured by Mitsubishi Chemical Corporation (triglycidyl para-aminophenol, number of epoxy groups: 3, corresponding to the epoxy amine compound (E))

B-3: "TETRAD-X" manufactured by MITSUBISHI GAS CHEMICAL COMPANY, INC. (N,N,N',N'-tetraglycidyl-m-xylylenediamine, number of epoxy groups: 4, corresponding to the epoxy amine compound (E))

D-1: zinc acetate ($Zn(OAc)_2$)

Example 1

Polyester resin (A-1) was used as the polyester resin having a carboxy group on a side chain, and 1,4-butanediol diglycidyl ether was used as the epoxy compound (B). Each material was blended at an amount ratio shown in Table 3 based on 100 parts by mole of the carboxy group of the polyester resin (A) having a carboxy group on a side chain, to produce a single-film sample (film sample 1) and a laminate sample (film sample 2) which are crosslinked polyester resin films. The results of performance evaluation of the obtained crosslinked polyester resin films are shown in Table 3.

Examples 2 to 9 and Comparative Examples 1 to 6

Examples 2 to 9 and Comparative Examples 1 to 6 were performed as in Example 1, except that the types and the amount ratio of the polyester resin (A) having a carboxy group on a side chain, the epoxy compound (B), and the transesterification catalyst (D) were changed as shown in Table 3 and Table 4 based on 100 parts by mole of the carboxy group of the polyester resin (A) having a carboxy group on a side chain. The results of performance evaluation are shown in Table 3 and Table 4. In Comparative Examples 4 to 6, the polymer polyol (a1) was used instead of the polyester resin (A) having a carboxy group on a side chain.

<Tensile Test>

Measurement was performed at room temperature using a Tensilon universal material testing machine manufactured by A&D Corporation, Limited. The film sample 1 cut out so as to have a thickness of 0.7 mm, a width of 1 cm, and a length of 5 cm was used for the measurement, and the strength and the Young's modulus thereof were measured at a tensile speed of 20 mm/min.

<Stress Relaxation Test>

A stress relaxation test was conducted using a rheometer MCR302 (manufactured by Anton Paar GmbH) at measurement temperatures between 100° C. and 250° C. at 10° C. intervals. A disk-shaped test piece having a diameter of 8 mm and a thickness of 0.7 mm and cut out from the film sample 1 was used for the test, and the test was conducted in a $N_2$ gas atmosphere. A vertical stress of 0.1 N was applied in order to prevent slippage of the sample. The shear strain was set to 10%. Occurrence of stress relaxation means a phenomenon in which the ratio $\sigma/\sigma_0$ of a stress $\sigma$ to an initial stress $\sigma_0$ becomes 0.7 or lower within $1\times10^4$ seconds when the stress relaxation test is conducted, and the temperature at which stress relaxation begins to occur is defined as a stress relaxation initiation temperature.

As the stress relaxation time (180° C.), the time when the elastic modulus measured at 180° C. reached 1/e (=0.37) times as much as the initial elastic modulus is described in the tables. The results are shown in Table 3 and Table 4.

FIG. 1 shows the results of stress relaxation measurement of Example 1. The vertical axis indicates the stress ($\sigma$) normalized by the initial stress ($\sigma_0$), and the horizontal axis indicates the elapsed time (seconds). As is obvious from FIG. 1, whereas no significant stress relaxation was observed at a measurement temperature of 100° C., significant stress relaxation was observed at high temperatures of 150° C. or higher. This is considered to be attributed to the fact that a transesterification reaction proceeded at high temperatures, resulting in stress dispersion. In addition, it is found that when the measurement temperature was further increased from 150° C., the stress relaxation rate increased with increasing temperature. This is considered to be attributed to the fact that the transesterification reaction was activated by temperature.

<Dynamic Viscoelasticity Measurement>

The dynamic viscoelasticity of the film sample 1 was measured in the range of −100° C. to 250° C. using DVA-200 (manufactured by IT Keisoku Seigyo K.K.). The measurement was performed in air at a temperature change rate of 4° C./min, and the measurement frequency was set to 1 Hz. The values of a storage elastic modulus (E') at the temperature at which stress relaxation began to occur in the stress relaxation measurement are shown in Table 3 and Table 4.

<PI/Cu Foil Peel Strength (Adhesiveness)>

The crosslinked polyester resin layer of the film sample 2 and a glossy surface of a rolled copper foil that was a copper-clad laminated sheet having a thickness of 49 μm (ESPANEX series, Cu/polyimide/Cu=12/25/12 μm, manufactured by NIPPON STEEL Chemical & Material Co., Ltd.) were attached together so as to be in contact with each other. The film sample 2 and the foil were pressed and adhered to each other under a pressure of 20.4 $kgf/cm^2$ at 170° C. for 280 seconds to obtain a laminate sample for peel strength evaluation. When the film sample 2 and the foil were not sufficiently adhered to each other at a stress relaxation initiation temperature of 150° C. or higher and under a lamination condition of 170° C., the sample production was performed with the pressing temperature increased to 180° C., 200° C., and 220° C. (hereafter referred to as lamination temperature). For the peel strength, a 90° peeling test was conducted by pulling the film at 25° C. at a tensile speed of 50 mm/min, to measure the peel strength. This test indicates the adhesive strength at room temperature. The results are shown in Table 3 and Table 4.

<Evaluation Criteria>

A: 1.0 N/mm or higher

B: 0.5 N/mm or higher and lower than 1.0 N/mm

C: 0.35 N/mm or higher and lower than 0.5 N/mm

D: lower than 0.35 N/mm

<Normal Solder Heat Resistance>

A sample was produced by the same method as the above PI/Cu foil peel strength measurement, and a sample piece of 2.0 cm×2.0 cm was floated in a heated solder bath for 1 minute, and the upper limit temperature at which no swelling occurred was measured at a 10° C. pitch. Specifically, the solder bath was heated from 250° C. to 280° C. in 10° C. increments. In this test, a higher measured value indicates better heat resistance. The results are shown in Table 3 and Table 4.

<Evaluation Criteria>

A: No swelling occurs even at 270° C. or higher.

B: Swelling occurs at 260° C. or higher and lower than 270° C.

C: Swelling occurs at lower than 260° C.

<Embeddability>

The film sample 2 was attached to a comb-shaped test pattern having circuits formed in line/space=50 μm/50 μm. The test pattern was a comb-type wiring pattern in which a line width (line) and an interline width (space) of Cu wiring formed on a support substrate having a thickness of 50 μm and made of polyimide were line/space=50 μm/50 μm, and a substrate for evaluation in which 10 lines on one side and 20 lines in total on both sides were alternated was used. The attachment was performed such that a circuit surface was in contact with the crosslinked polyester resin layer of the film sample 2, and vacuum pressing was performed under a pressure of 2 MPa for 280 seconds to produce a sample for embeddability evaluation. The temperature conditions during vacuum pressing were the same as the lamination temperature described above. The sample after pressing was observed with a digital microscope (VHX-2000) manufactured by KEYENCE CORPORATION to see if the adhesive agent layer was embedded between circuits. The results are shown in Table 3 and Table 4.

<Evaluation Criteria>

A: The adhesive agent layer is embedded between circuits.

B. Embedding is insufficient and voids are observed between circuits.

<Dielectric Breakdown Reliability>

A sample for dielectric breakdown reliability evaluation was produced by the same method as the above sample for embeddability evaluation. A voltage of 200 V was applied to the obtained sample for dielectric breakdown reliability evaluation, and an insulation resistance value under a high temperature and high humidity of 85° C. and 85% RH (relative humidity) was evaluated continuously from 0 to 250 hours after the voltage was applied. The results are shown in Table 3 and Table 4. FIG. 2 shows the results of dielectric breakdown reliability of Examples 5 and 7.

<Evaluation Criteria>

A: The resistance value from 0 to 250 hours exceeds $1\times10^{10}\Omega$, and there is no change in appearance.

B: The resistance value from 0 to 250 hours is $1\times10^{8}$ to $1\times10^{10}\Omega$, and there is no change in appearance.

C: The resistance value from 0 to 250 hours is lower than $1\times10^{8}\Omega$, or abnormal appearance (occurrence of ion migration) is observed.

<Long-Term Heat-Resistant Adhesiveness>

A sample for long-term heat-resistant adhesiveness was produced by the same method as the above PI/Cu foil peel strength measurement. The sample was heated in air at 150° C. for 1000 hours and was peeled at 90° at a tensile speed of 50 mm/min. The results are shown in Table 3 and Table 4.

<Evaluation Criteria>

A: The 90° peel strength after 1000 hours at 150° C. exceeds 1.0 N/mm.

B: The 90° peel strength after 1000 hours at 150° C. is 0.5 to 1.0 N/mm.

C: The 90° peel strength after 1000 hours at 150° C. is lower than 0.5 N/mm.

<Bending Resistance>

The film sample 2 was attached such that a glossy surface of a rolled copper foil that was a copper-clad laminated sheet having a thickness of 49 μm (ESPANEX series, Cu/polyimide/Cu=12/25/12 μm, manufactured by NIPPON STEEL Chemical & Material Co., Ltd.) was in contact with the film sample 2. The film sample 2 and the foil were pressed and adhered to each other under a pressure of 20.4 kgf/cm$^2$ for 280 seconds to obtain a sample for evaluation. The temperature conditions during pressing were the same as the lamination temperature described above.

This sample was cut into a strip shape of 10 cm×1 cm, and the number of times of bending when cracking occurred was recorded using a BE-202 MIT folding endurance tester manufactured by TESTER SANGYO CO. LTD., under conditions of a load of 300 g, a chuck opening of 0.25 mm, and chuck tip R=0.38 mm. The results are shown in Table 3 and Table 4.

<Evaluation Criteria>

A: No cracking occurs after 250 times or more of bending.

B: No cracking occurs after 200 times or more of bending.

C: Cracking occurs after less than 200 times of bending.

<Room Temperature Storage Stability>

(1) Gel Fraction

Film sample 1 of 0.125 g was weighed and immersed in 25 ml of methyl ethyl ketone at room temperature for 2 hours. Then, only the gel component was dried in a vacuum dryer at 80° C. for 1 hour, and the weight of the gel component was measured. The gel fraction was determined by the following equation.

Gel fraction (%)=weight of gel component after immersion and drying÷weight of sample before test×100

The gel fraction of the crosslinked polyester resin film (film sample 1) stored at 25° C. was measured at the start and after 6 months, and a rate of change from the initial value was calculated, and the room temperature storage stability (gel fraction) was evaluated based on the rate of change. The rate of change was defined as the absolute value of the difference in gel fraction (%) before and after storage for 6 months, as shown in the following equation.

Rate of Change=|gel fraction (%) at elapse of 6 months−gel fraction (%) at start of storage|

<Evaluation Criteria>

A: Rate of change was less than 10

B: Rate of change was 10 or more and less than 25

C: Rate of change was 25 or more (2) Presence or Absence of Softening Behavior

For the room temperature storage stability (softening behavior), the presence or absence of softening behavior due to a bond exchange reaction when the film sample 1 was stored at 25° C. for a long period of time (6 months) was evaluated by stress relaxation measurement.

The film sample 1 after storage at 25° C. for 6 months was measured under the same conditions as the above stress relaxation test, and the presence or absence of softening behavior was evaluated.

As a result, stress relaxation being observed in the sample after storage at 25° C. for 6 months indicates that softening properties due to bond exchange are maintained and remain unchanged from the initial behavior during the storage at room temperature for a long period of time. The results are shown in Table 3 and Table 4.

<Evaluation Criteria>

A: There was softening behavior (stress relaxation occurred).

B: There was no softening behavior (no stress relaxation occurred).

TABLE 3

| | | | Examples and Comparative Examples | | | | | | | | |
|---|---|---|---|---|---|---|---|---|---|---|---|
| | | | Example 1 | Example 2 | Example 3 | Example 4 | Example 5 | Example 6 | Example 7 | Example 8 | Example 9 |
| Composition | Type of polyester resin (A) having a carboxy group on a side chain | | A-1 | A-1 | A-1 | A-1 | A-1 | A-1 | A-1 | A-2 | A-2 |
| | Epoxy compound (B) | B-1 | 50 | 50 | 90 | — | — | — | 25 | 50 | — |
| | (parts by mole/100 parts by mole | B-2 | — | — | — | 33 | — | — | — | — | — |
| | of the carboxy group of (A)) | B-3 | — | — | — | — | 25 | 25 | 12.5 | — | 25 |
| | Transesterification catalyst (D) (parts by mole/100 parts by mole of the carboxy group of (A) | D-1 | 20 | 10 | 20 | 20 | 20 | — | 10 | 20 | 20 |
| Property | Stress relaxation initiation temperature | ° C. | 120 | 150 | 150 | 180 | 180 | 180 | 170 | 160 | 180 |
| | Stress relaxation time (180° C.) | sec | 308 | 330 | 322 | 3732 | 3552 | 3590 | 1075 | 330 | 9000 |
| | Elastic modulus of above the temperature at which stress relaxation occurs | MPa | 0.264 | 0.529 | 0.101 | 0.975 | 0.287 | 0.667 | 0.169 | 0.275 | 0.531 |
| | Tensile test (strength) | MPa | 6.3 | 6.4 | 1.2 | 3.7 | 8.6 | 15.9 | 8.5 | 7.2 | 8.8 |
| | Tensile test (Young's modulus) | GPa | 0.003 | 0.004 | 0.001 | 0.004 | 0.04 | 0.008 | 0.003 | 0.006 | 0.06 |
| Performance evaluation | Lamination temperature | ° C. | 170 | 170 | 170 | 170 | 200 | 220 | 180 | 170 | 220 |
| | Peel strength of PI/Cu foil | — | A | A | A | B | B | B | A | B | B |
| | Normal solder heat resistance | — | A | A | A | B | B | A | A | A | A |
| | Embeddability | — | A | A | A | A | A | A | A | A | A |
| | Dielectric breakdown reliability | — | B | A | B | B | B | A | A | B | B |
| | Long-term heat-resistant adhesiveness | — | A | A | A | A | A | A | A | A | A |
| | Bending resistance | — | A | A | A | A | B | B | A | B | B |
| | Room temperature storage stability (gel fraction) | — | A | A | A | A | A | A | A | A | A |
| | Room temperature storage stability (softening behavior) | — | A | A | A | A | A | A | A | A | A |

TABLE 4

| | | | Examples and Comparative Examples | | | | | |
|---|---|---|---|---|---|---|---|---|
| | | | Comparative Example 1 | Comparative Example 2 | Comparative Example 3 | Comparative Example 4 | Comparative Example 5 | Comparative Example 6 |
| Composition | Type of polyester resin (A) having a carboxy group on a side chain | | A-1 | A-1 | A-3 | A1-1 | A1-3 | A1-4 |
| | Epoxy compound (B) (parts by mole/100 parts by mole of the carboxy group of (A)) | B-1 | 50 | — | 50 | 50 | 50 | 50 |
| | | B-2 | — | 33 | — | — | — | — |
| | | B-3 | — | — | — | — | — | — |
| | Transesterification catalyst (D) (parts by mole/100 parts by mole of the carboxy group of (A)) | D-1 | — | — | 20 | 20 | 20 | 20 |
| Property | Stress relaxation initiation temperature | ° C. | None | >250 | >250 | No measurement because a film could not be formed | | |
| | Stress relaxation time (180° C.) | sec | — | >10000 | >10000 | | | |
| | Elastic modulus of above the temperature at which stress relaxation occurs | MPa | Measured at 150° C. 1.249 | Measured at 170° C. 1.711 | — | | | |
| | Tensile test (strength) | MPa | 6.3 | 3.7 | 15.5 | | | |
| | Tensile test (Young's modulus) | GPa | 0.004 | 0.005 | 0.04 | | | |
| Performance evaluation | Lamination temperature | ° C. | 220 | 220 | 220 | No performance evaluation because a film could not be formed | | |
| | Peel strength of PI/Cu foil | — | — | — | — | | | |
| | Normal solder heat resistance | — | — | — | — | | | |
| | Embeddability | — | — | — | — | | | |
| | Dielectric breakdown reliability | — | — | — | — | | | |
| | Long-term heat-resistant adhesiveness | — | — | — | — | | | |
| | Bending resistance | — | — | — | — | | | |
| | Room temperature storage stability (gel fraction) | — | C | A | A | | | |
| | Room temperature storage stability (softening behavior) | — | B | A | A | | | |

As is obvious from Table 3 and Table 4, Examples 1 to 9 have excellent room temperature storage stability and have high strength due to a crosslinked structure. And examples 1 to 9 have excellent adhesiveness to the base material (polyimide, copper foil), excellent solder heat resistance, and excellent dielectric breakdown reliability as an adhesive sheet. In contrast, Comparative Example 1 did not have the transesterification catalyst (D) and did not exhibit stress relaxation properties, so that the adhesion to the base material at the lamination temperature was insufficient, therefore it was impossible to produce a film sample 2 which is a laminate with a polyimide film, and it was impossible to perform the performance evaluation. In Comparative Examples 2 and 3, stress relaxation was observed, but at 180° C., the relaxation modulus did not reach 0.37 times as much as the initial relaxation modulus within $1\times10^4$ seconds. Therefore sufficient softening behavior due to bond exchange was not exhibited, and the adhesion to the base material at the lamination temperature was insufficient. Consequently it was impossible to produce a film sample 2 which is a laminate with a polyimide film, and it was impossible to perform the performance evaluation. In Comparative Examples 4 to 6, since the polyester resin did not have a carboxy group on a side chain, the crosslink density with the epoxy compound was low, therefore it was impossible to produce a coating film. Consequently it was impossible to perform the evaluation.

INDUSTRIAL APPLICABILITY

The crosslinked polyester resin of the present invention has high adhesiveness to a resin base material such as polyimide and polyethylene terephthalate films and a metal base material such as a copper foil, and has high heat resistance. The crosslinked polyester resin of the present invention also has excellent room temperature storage stability and dielectric breakdown reliability (electrical properties). In addition, the crosslinked polyester resin exhibits softening behavior at high temperatures and therefore has followability with respect to a base material. And the crosslinked polyester resin is also capable of adhering base materials to each other without defects such as cracks caused by the thermal expansion difference between the base materials. Therefore, the crosslinked polyester resin of the present invention can be used as an adhesive agent and an adhesive sheet, and is particularly useful in applications to printed wiring boards due to the above properties.

The invention claimed is:

1. A crosslinked polyester resin (C) having a structure obtained by reacting a polyester resin (A) having a carboxy group on a side chain with an epoxy compound (B), wherein a time for which a relaxation modulus reaches 0.37 times as much as an initial relaxation modulus when measured at a shear strain of 10% and 180° C. with a vertical stress of 0.1 N applied using a rheometer is $1\times10^1$ seconds to $1\times10^4$ seconds;

the crosslinked polyester resin (C) satisfies at least one of the following requirements (1) and (2), (1) a transesterification catalyst (D) is contained, and (2) the epoxy compound (B) is an epoxy amine compound (E) having a tertiary amino group; and the crosslinked polyester resin (C) has an elastic modulus of 0.1 MPa or higher and 1.2 MPa or lower at a temperature equal to or higher than a stress relaxation initiation temperature, when the elastic modulus is determined by using a dynamic viscoelasticity measuring device under a measurement temperature between −100° C. and 250° C. at a frequency of 1 Hz.

2. The crosslinked polyester resin (C) according to claim 1, wherein the polyester resin (A) has an acid value of 7 to 40 mg KOH/g.

3. The crosslinked polyester resin (C) according to claim 1, wherein the polyester resin (A) contains a polymer polyol (a1) having a number average molecular weight of 7,000 or higher, a polymer polyol (a2) having a number average molecular weight of 1,000 or higher and lower than 7,000, and tetracarboxylic dianhydride.

4. A method for preparing the crosslinked polyester resin (C) according to claim 1, the method comprising:

heating a mixture containing a polyester resin (A) having a carboxy group on a side chain and an epoxy amine compound (E) having a tertiary amino group.

5. An adhesive agent composition containing the crosslinked polyester resin (C) according to claim 1.

6. An adhesive sheet comprising an adhesive agent layer made of the crosslinked polyester resin (C) according to claim 1.

7. The adhesive sheet according to claim 6, which has a 90° peel strength of 0.5 N/mm or higher when the 90° peel strength is measured from a laminate film comprising the adhesive sheet positioned between a polyimide film and a copper foil.

8. A printed wiring board comprising the adhesive sheet according to claim 6.

9. A coverlay film comprising the adhesive sheet according to claim 6.

10. A method for producing the printed wiring board according to claim 8, the method comprising an attaching and heating step, wherein the attaching and heating step is conducted at a temperature equal to or higher than the stress relaxation initiation temperature of the crosslinked polyester resin (C).

11. The method for preparing the crosslinked polyester resin (C) according to claim 4, wherein the epoxy amine compound (E) is at least one selected from the group consisting of N,N,N',N'-tetraglycidyl-m-xylenediamine, 4,4'-methylenebis(N,N-diglycidylaniline) and triglycidyl para-aminophenol.

* * * * *